United States Patent
Joo et al.

(10) Patent No.: US 9,482,885 B2
(45) Date of Patent: Nov. 1, 2016

(54) DISPLAY DEVICE AND METHOD OF MANUFACTURING THE SAME

(71) Applicant: SAMSUNG DISPLAY CO., LTD., Yongin, Gyeonggi-Do (KR)

(72) Inventors: So Yeon Joo, Asan-si (KR); Su Kyoung Kim, Cheonan-si (KR); Hyeon Deuk Hwang, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/682,350

(22) Filed: Apr. 9, 2015

(65) Prior Publication Data

US 2016/0161770 A1 Jun. 9, 2016

(30) Foreign Application Priority Data

Dec. 9, 2014 (KR) .......................... 10-2014-0175769

(51) Int. Cl.
*G02F 1/03* (2006.01)
*G02F 1/01* (2006.01)
*G02F 1/153* (2006.01)

(52) U.S. Cl.
CPC ........... *G02F 1/0102* (2013.01); *G02F 1/0126* (2013.01); *G02F 1/0147* (2013.01); *G02F 1/1533* (2013.01); *G02F 2001/1536* (2013.01)

(58) Field of Classification Search
USPC .................................... 359/240–251
See application file for complete search history.

(56) References Cited

U.S. PATENT DOCUMENTS

| 8,933,477 B2* | 1/2015 | Jeong ...................... H01L 33/42 |
| | | 257/98 |
| 2012/0268696 A1* | 10/2012 | Yim .......................... G09G 3/32 |
| | | 349/104 |
| 2014/0153217 A1* | 6/2014 | Kang ...................... G02B 5/23 |
| | | 362/84 |

FOREIGN PATENT DOCUMENTS

| JP | 2012-224711 A | 11/2012 |
| KR | 10-2004-0103695 A | 12/2004 |
| KR | 10-2006-0026628 A | 3/2006 |
| KR | 10-2014-0063304 A | 5/2014 |

* cited by examiner

*Primary Examiner* — Mohammed Hasan
(74) *Attorney, Agent, or Firm* — Lee & Morse, P.C.

(57) ABSTRACT

A display device, including a display panel displaying an image; a cover receiving the display panel therein; and a protective layer between the display panel and the cover and including a chromic material.

20 Claims, 5 Drawing Sheets

DISPLAY DEVICE AND METHOD OF MANUFACTURING THE SAME

CROSS-REFERENCE TO RELATED APPLICATION

Korean Patent Application No. 10-2014-0175769, filed on Dec. 9, 2014, in the Korean Intellectual Property Office, and entitled: "Display Device and Method of Manufacturing The Same," is incorporated by reference herein in its entirety.

BACKGROUND

1. Field

Provided are a display device and a method of manufacturing the same.

2. Description of the Related Art

Various flat panel display devices include liquid crystal display (LCD) devices, plasma display panel (PDP) display devices, and an organic light-emitting diode (OLED) display devices.

SUMMARY

Embodiments may be realized by providing a display device, including a display panel displaying an image; a cover receiving the display panel therein; and a protective layer between the display panel and the cover and including a chromic material.

The chromic material may be a photochromic material that is discolored in response to light being applied thereto.

The protective layer may further include a latent pigment.

The latent pigment may include a phase change material and a polymer surrounding the phase change material.

The display device may further include a protective sheet between the protective layer and the cover.

The protective sheet may not include a light-shielding sheet.

The display panel may include a first substrate and a second substrate, the second substrate being on a first surface of the first substrate, and the protective layer may cover an entire second surface of the first substrate.

The chromic material may be a thermochromic material that is discolored at a temperature within a predetermined temperature range.

The chromic material may be an electrochromic material that is discolored in response to a current with a predetermined level being applied thereto.

The protective layer may be formed by screen printing.

Embodiments may be realized by providing a method of manufacturing a display device, the method including preparing a display device including a first substrate and a second substrate, the second substrate being on a first surface of the first substrate; forming a protective layer on a second surface of the first substrate; forming an integrated circuit (IC) chip on the first surface of the first substrate; coupling the second substrate and a cover window together; and discoloring the protective layer.

The display device may further include a polarizing member, which is on the second substrate.

The protective layer may include a latent pigment, which has a phase change material, and a polymer surrounding the phase change material.

The method may further include placing a protective sheet on a surface of the protective layer opposite to a surface of the protective layer contacting the display device.

The IC chip may be in a mounting area of the first substrate where the first substrate is not bonded to the second substrate, and forming the IC chip may include forming a flexible printed circuit board (FPCB), which transmits a driving signal to the IC chip, in the mounting area.

The method may further include, before discoloring the protective layer, determining, from the second surface of the first substrate, whether the IC chip has been properly mounted.

The protective layer may include a photochromic material that is discolored in response to light being applied thereto.

Coupling the second substrate and the cover window together may include applying ultraviolet (UV) light to an adhesive layer, which is interposed between the second substrate and the cover window, and discoloring the protective layer may include applying the UV light to the protective layer.

Forming the protective layer may include curing the protective layer at a temperature within a first temperature range, the protective layer may include a thermochromic material that is discolored at a temperature within a second temperature range, which is higher than the first temperature range, and iscoloring the protective layer may include heating the protective layer to the temperature within the second temperature range.

The protective layer may include an electrochromic material that is discolored in response to a current with a predetermined level being applied thereto, and discoloring the protective layer may include applying the current with the predetermined level to the protective layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
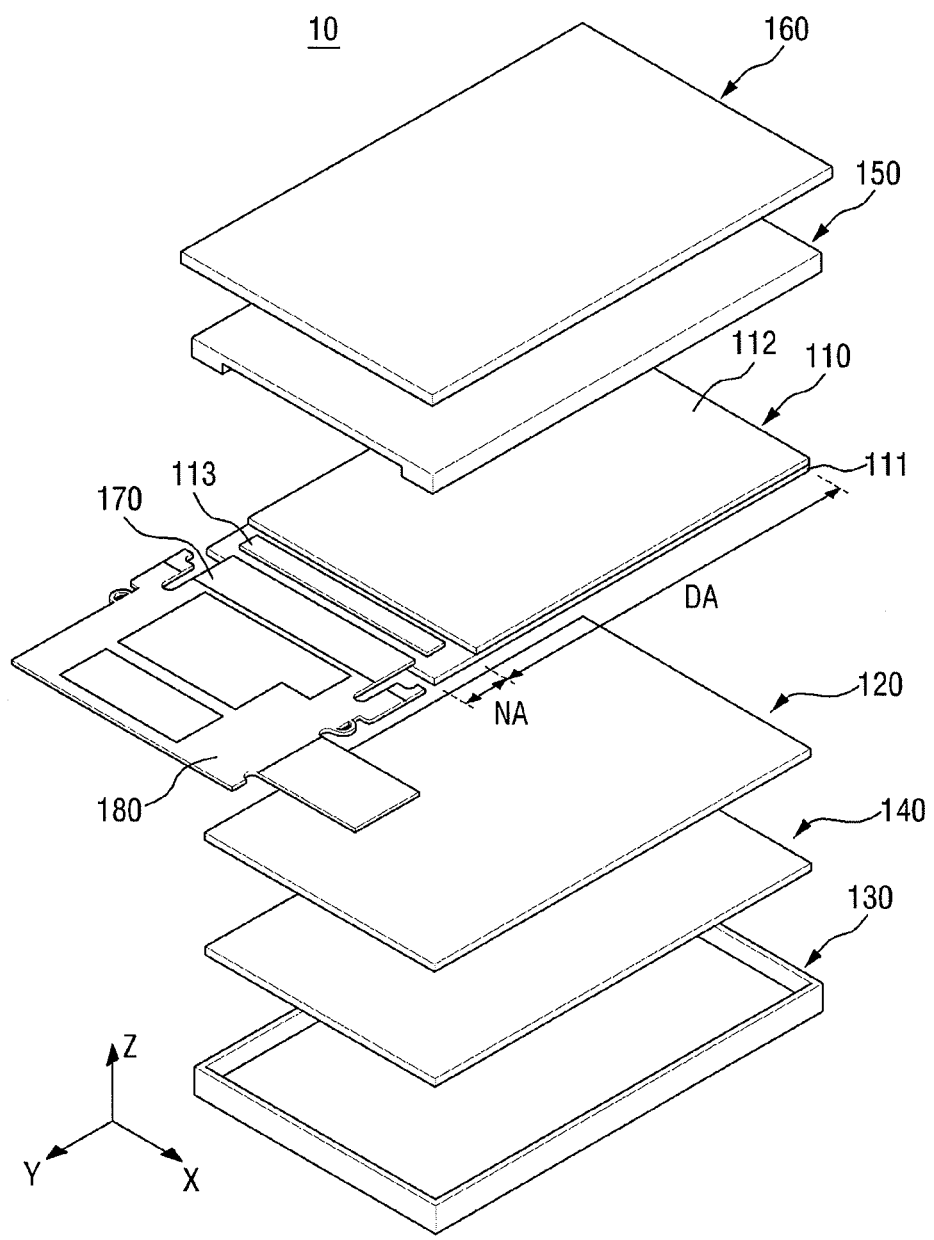
FIG. 1 illustrates an exploded perspective view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include mean to targets in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Exemplary embodiments will hereinafter be described with reference to the accompanying drawings.

Figure 2:
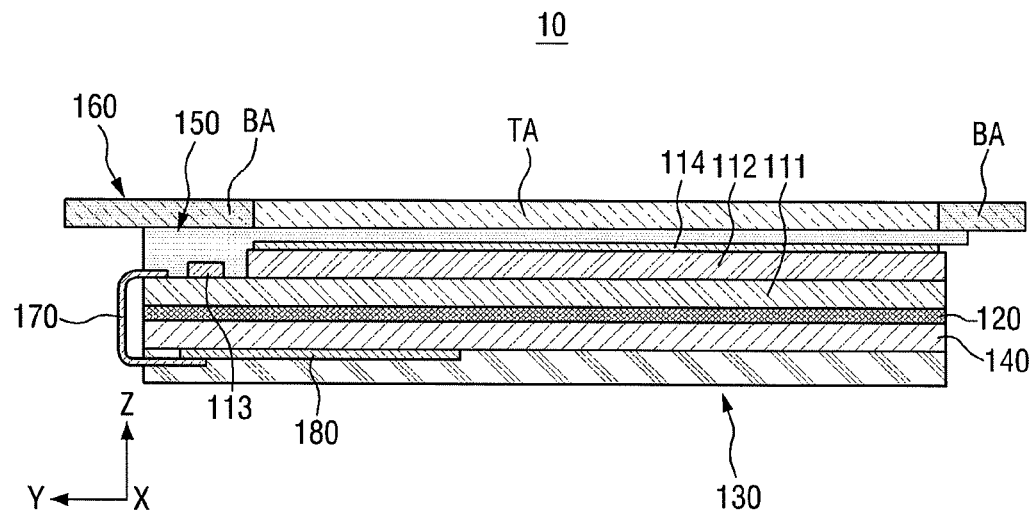
FIG. 2 illustrates a cross-sectional view of the display device.
Figure 3:
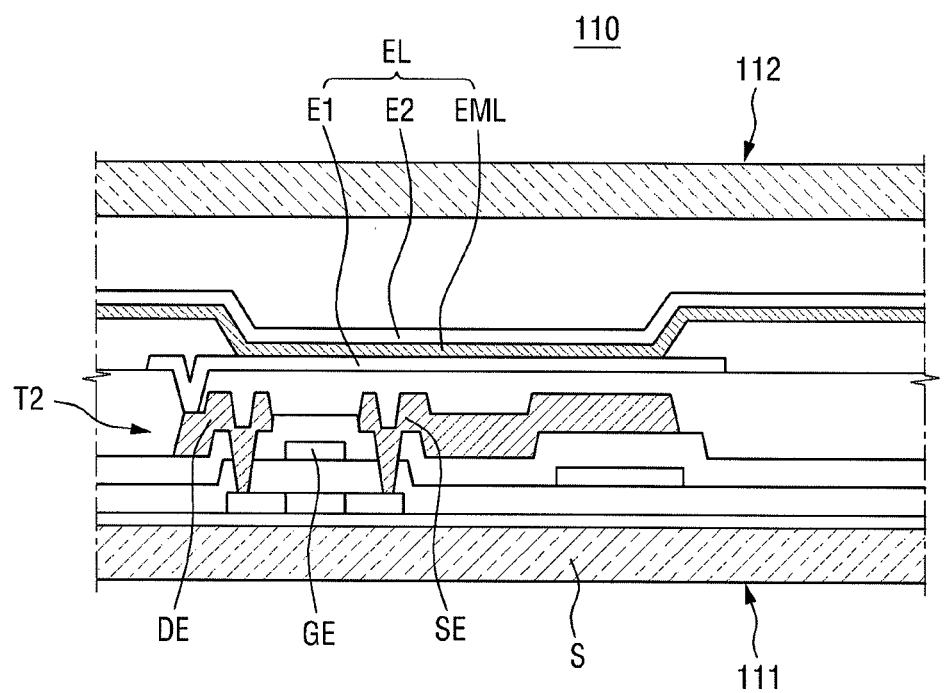
FIG. 3 illustrates a cross-sectional view of a display panel illustrated in FIG. 1.

FIG. 1 illustrates an exploded perspective view of a display device according to an exemplary embodiment, FIG. 2 illustrates a cross-sectional view of the display device, and FIG. 3 illustrates a cross-sectional view of a display panel illustrated in FIG. 1. Referring to FIGS. 1 to 3, a display device 10 may include a display panel 110, a protective layer 120 and a bottom cover 130. The display device may also include a protective sheet 140, an adhesive layer 150, a cover window 160, a flexible printed circuit board (FPCB) 170 and a driving circuit board 180.

The display panel 110, which may be a panel for displaying an image, may be a liquid crystal display (LCD) panel, an electrophoretic display panel, an organic light-emitting diode (OLED) panel, a light-emitting diode (LED) panel, an inorganic electroluminescent (EL) display panel, a field emission display (FED) panel, a surface-conduction electron-emitter display (SED) panel, a plasma display panel (PDP), or a cathode ray tube (CRT) display panel. In the description that follows, the display device 10 and the display panel 110 may be, for example, an OLED display device and an OLED display panel, respectively. In an exemplary embodiment, various other display devices and display panels may be included.

The display panel 110 may include a first substrate 111, a second substrate 112 and an integrated circuit (IC) chip 113. The first and second substrate 111 and 112 may be bonded together to form the display panel 110.

The first substrate 111 may be divided into a display area DA where the first substrate 111 is bonded to the second substrate 112 and a mounting area NA where the IC chip 113 is mounted. For example, the second substrate 112 may be smaller than the first substrate 111, and an area of the first substrate 111 over which the second substrate 112 is bonded may be the display area DA. The first and second substrates 111 and 112 may be bonded and sealed together by a sealant, which may be arranged along the boundaries of the second substrate 112. An area of the first substrate 111 where the first substrate 111 is not bonded to the second substrate 112 may be the mounting area NA. The IC chip 113 may be mounted in the mounting area NA of the first substrate 111. The second substrate 112 is not bonded to the first substrate 111 in the mounting area NA, and a height difference may be generated between the display area DA and the mounting area NA.

The first substrate 111 may include a plurality of pixels, which may be arranged in the display area DA in a matrix form. In each of the pixels, an OLED (EL), e.g., an electroluminescent organic light-emitting diode or OLED "EL", and at least one thin-film transistor (T2) may be formed. The first substrate 111 may also include pad electrodes, which may be arranged in the mounting area NA, and the IC chip 113 may be mounted in the mounting area NA that may be electrically connected to the pad electrodes. The first substrate 111 may also include wires, which may connect the IC chip 113 in the mounting area NA and the pixels in the display area DA.

FIG. 3 illustrates a cross-sectional view of the display panel 110. Referring to FIG. 3, the display panel 110 may include a plurality of pixels, and may display an image. The pixels may be formed on the first substrate 110. Each of the pixels may include an OLED "EL", at least one transistor and at least one storage capacitor. For example, each of the pixels may include a driving transistor T2, which may drive the OLED "EL", and a switching transistor, which may transmit a data voltage to the driving transistor T2. The switching transistor may be connected to a scan line and a data line, and may transmit a data voltage provided thereto via the data line to the driving transistor T2 according to a switching voltage provided thereto via the scan line.

The storage capacitor may be connected to the switching transistor and a power line, and may store a voltage corresponding to the difference between a voltage provided by the switching transistor and a voltage provided by the power line.

The driving transistor T2 may include a source electrode SE, a drain electrode DE and a gate electrode GE, and an anode electrode E1 of the OLED "EL" may be connected to the drain electrode DE of the driving transistor T2. The OLED "EL" may emit light according to a driving current provided by the drain electrode DE. An exemplary structure of the pixels is illustrated in FIG. 3.

The second substrate 112 may cover the first substrate 111 where the OLED "EL" and the driving transistor T2 are formed. For example, the second substrate 112 may be bonded onto the first substrate 111, and may seal and protect the OLED "EL", the driving transistor T2, and the wires formed on the first substrate 111.

In an exemplary embodiment, the display panel 110 may also include a polarizing member 114, which may be attached onto one surface of the second substrate 112, and may suppress the reflection of external light. The polarizing member 114 may be optional.

The IC chip 113 may be mounted in the mounting area NA of the first substrate 111 in a chip-on-glass (COG) manner. The IC chip 113 may transmit a driving signal to each of the pixels formed in the display area DA of the first substrate 111.

The driving circuit board 180 may include various electronic elements for processing a driving signal. The FPCB 170 may be connected to the mounting area NA of the first substrate 111 on one side thereof, and may be connected to the driving circuit board 180 on the other side thereof. For example, the FPCB 170 may electrically connect the driving circuit board 180 and the display panel 110 together, and a driving signal generated by the driving circuit board 180 may be transmitted to the IC chip 113 or a driver of the first substrate 111 via the FPCB 170. As illustrated in FIG. 2, the FPCB 170 may be bent so that the driving circuit board 180 may be disposed on a bottom surface of the protective sheet 140.

The cover window 160 may be disposed to face the second substrate 112 and the IC chip 113, and may cover the entire display panel 100. For example, the cover window 160 may cover a surface of the display panel 110 where an image may be displayed. The cover window 160 may be formed of a transparent material such as glass or plastic.

As illustrated in FIG. 2, the cover window 160 may include a light-blocking area BA, which may correspond to the edges of the display panel 110, including the mounting area NA of the first substrate 51, and a light-transmitting area TA, which may correspond to a central part of the display panel 110. For example, the light-blocking area BA may correspond to the edges of the display area DA and the mounting area NA, and the light-transmitting area TA may correspond to the central part of the display area DA. The light-blocking area BA may block unnecessary light, and may cover part of the display panel 110 where no image may be displayed.

The adhesive layer 150 may fill the gap between the display panel 110 and the cover window 160. For example, the adhesive layer 150 may fill the gap between the display panel 110 and the cover window 160, and may couple the cover window 160 and the display panel 110 together.

The adhesive layer 150 may be formed to have as similar a refractive index as possible to that of the cover window 160, and light reflection that may be caused by a difference in refractive index may be minimized. The adhesive layer 150 may be formed of a material including an acryl-based resin that is curable by ultraviolet (UV) light or heat. The refractive index of the acryl-based resin may be more similar to the refractive index of the cover window 160 than to the refractive index of the air, the adhesive layer 150 may fill the gap between the second substrate 112 and the cover window 160, and the adhesive layer 150 may effectively reduce light reflection caused by a difference in refractive index. The adhesive layer 150 may be formed to have higher elasticity than the cover window 160 and the bottom cover 130. The adhesive layer 150 not only may prevent the display panel 110 and the cover window 160 from being peeled off from each other, but may also protect the display panel 110, for example, due to its relatively excellent elasticity. The adhesive layer 150 may improve the mechanical stability and reliability of the display device 10. For example, the adhesive layer 150 may protect the display panel 110 from external impact. The adhesive layer 150 may prevent moisture from infiltrating into the display panel 110, and may improve the environmental stability and reliability of the display device 10.

The bottom cover 130 may receive and support the display panel 110 and the driving circuit board 180 therein. The bottom cover 130 may be formed as a box having a flat bottom and sidewalls extended from the flat bottom. A bracket may be disposed between the driving circuit board 180 and the bottom cover 130, and may be coupled to the bottom cover 130. The bracket may be another bottom cover for the display panel 110, and may be a top cover for the bottom cover 130. The bottom cover 130 may be formed in various manners using various materials. For example, the bottom cover 130 may be formed of a highly rigid material, i.e., a metal material such as stainless steel, cold rolled steel, aluminum, an aluminum alloy, a nickel alloy, magnesium, or a magnesium alloy, or a plastic material. A metal plate or a plastic resin plate formed of such metal material or plastic material may be subjected to a molding process such as deep drawing or bending, and the bottom cover 130 with a bottom and sidewalls may be formed.

The protective layer 120 may be disposed between the display panel 110 and the bottom cover 130. The protective layer 120 may be disposed on a second surface of the first substrate 111. The second surface of the first substrate 111 may be a bottom surface of the first substrate 111. For example, the protective layer 120 may be disposed directly on the bottom surface of the first substrate 111. The protective layer 120 may protect the display panel 110 against, e.g., from, external impact that may be generated at the bottom of the display panel 110. For example, the protective layer 120 may protect the display panel 110 against being scratched or damaged by impact during the fabrication of the display device 10.

The protective sheet 140 may be disposed between the protective layer 120 and the bottom cover 130. The protective sheet 140 may also protect the display panel 110 against external impact. The protective sheet 140 may protect the display panel 110 against external impact that may be generated during the operation of the display device 10. For example, the display panel 110 may provide robust protection against, e.g., from, external impact.

The protective layer 120 may include a chromic material. The color of the chromic material may change under certain conditions, and the entire color of the protective layer 120 may change. The protective layer 120 may also include a latent material. The latent material may absorb heat during the operation of the display device 10, and may discharge the absorbed heat when the display device 10 is not in use. The protective layer 120 and the protective sheet 140 will hereinafter be described in further detail with reference to FIGS. 4 to 6.

Figure 4:
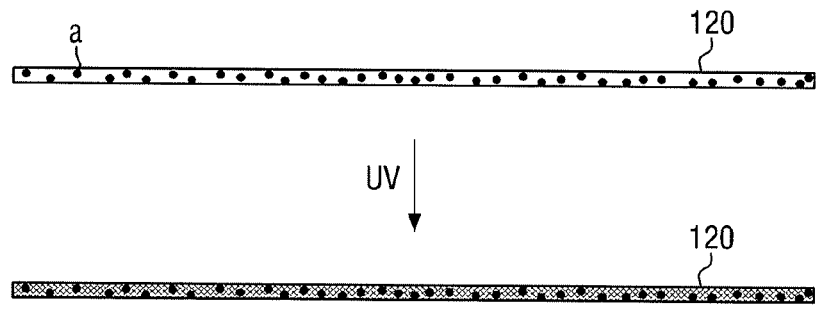
FIG. 4 illustrates a schematic view of variations in a protective layer illustrated in FIG. 1.
Figure 5:
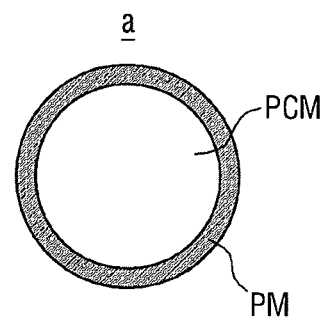
FIG. 5 illustrates a schematic view of a latent material included in the protective layer.
Figure 6:
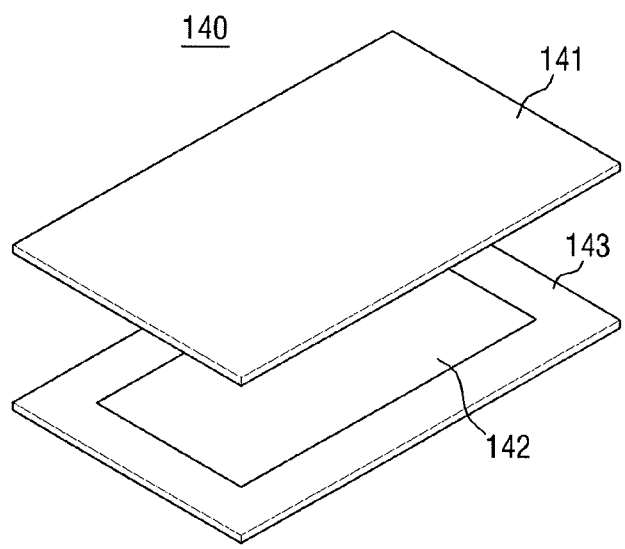
FIG. 6 illustrates a perspective view of a protective sheet illustrated in FIG. 1.

FIG. 4 illustrates a schematic view of variations in the protective layer 120, FIG. 5 illustrates a schematic view of the latent material included in the protective layer 120, and FIG. 6 illustrates a perspective view of the protective sheet 140. Referring to FIGS. 4 to 6, the protective layer 120 may include a chromic material. The protective layer 120 may be a coating layer formed by screen printing. For example, the protective layer 120 may be formed by screen-printing a composition, including a thermal curing agent, fine powder silica, a silicone anti-foaming agent, an antistatic agent, a petroleum naphtha solvent, and diethyl glycol monoethyl ether acetate, on the second surface of the first substrate 111, and subjecting the first substrate 111 to thermal curing. The protective layer 120 may be printed on the entire second surface of the first substrate 111, and may be formed to cover the entire second surface of the first substrate 111. The protective layer 120 may have a thickness of 8 μm to 14 μm.

The composition for forming the protective layer 120 may also include a chromic material. The chromic material may be a material that may be converted from its colorless state to its colored state in response to light, heat, or a current being applied thereto. The chromic material may be distributed throughout the entire protective layer 120, and the color of the protective layer 120 may be determined by the color of the chromic material.

In an exemplary embodiment, the protective layer 120 may include a photochromic material that undergoes a change in its molecular structure, and may be converted to its colored state in response to light being applied thereto. In an exemplary embodiment, the protective layer 120 may include a photochromic material such as spiropyran, spirooxazines, diarylethenes or aminoazobenzene, and may be discolored in response to light of a predetermined wavelength being applied thereto. As illustrated in FIG. 4, the protective layer 120 may be discolored in response to ultraviolet (UV) light being applied thereto.

In an exemplary embodiment, the protective layer 120 may include an electrochromic material such as tungsten trioxide or viologen. For example, the protective layer 120 may be converted from its colorless state to its colored state in response to a current with a predetermined level being applied thereto.

In an exemplary embodiment, the protective layer 120 may include a thermochromic material that is discolored under conditions at a predetermined temperature or higher. For example, the protective layer 120 may be discolored under conditions at the predetermined temperature or higher.

The protective layer 120 may be initially transparent when formed, or cured, on a second surface of the display panel 110. The protective layer 120 may be discolored after an auto trace test, which may determine whether the IC chip 113 has been mounted normally during the fabrication of the display device 10. The discoloration of the protective layer 120 will be described later in further detail. Once discolored, the protective layer 120 may prevent light emitted from the display panel 110 from leaking from below the bottom of the display panel 110. For example, the protective layer 120 not only may protect the display panel 110 against external impact that may be generated during the fabrication of the display device 10, but may also block the light emitted from the display panel 110. The display device 10, unlike a comparative display device, may not include a light-shielding sheet in the protective sheet 140.

As illustrated in FIG. 6, the protective sheet 140 may include a first heat dissipation sheet 141, a second heat dissipation sheet 142 and a buffer sheet 143.

The first heat dissipation sheet 141 may be disposed near a second surface of the protective layer 120. The first heat dissipation sheet 141 may be a plate-shaped sheet, and may quickly transmit or diffuse heat generated by the display panel 110 to the outside by using its large specific surface area. The first heat dissipation sheet 141 may be formed of a metal with excellent thermal conductivity, such as, for example, silver, copper, a copper alloy, or aluminum.

The buffer sheet 143 may be formed of a polymer resin with elasticity. The buffer sheet 143 may be formed of a polyolefin-based resin such as a polyethylene (PE) resin or a polypropylene (PP) resin, a melamine resin, a phenol resin, an acrylic resin, a polyvinyl chloride (PVC) resin, a polyurethane (PU) resin, a urea resin, a polystyrene (PS) resin, or a polyvinyl acetate (PVA) resin. For example, the buffer sheet 143 may be polymer foam. The buffer sheet 143 may be melamine foam, phenol foam, acrylic foam, PVC foam, PP foam, PU foam, urea foam, PE foam, PS foam, or PVA foam. The buffer sheet 143 may protect the display panel 110 against external impact. For example, the buffer sheet 143 may absorb external impact applied thereto, and may improve the impact resistance of the display panel 110. The buffer sheet 143 may include a through hole, which may be the space into which the second heat dissipation sheet 142 may be inserted and mounted. In an exemplary embodiment, the buffer sheet 143 may have a single rectangular through hole, as illustrated in FIG. 6. The second heat dissipation sheet 142 may be inserted into the through hole of the buffer sheet 143, and may be formed in various shapes, conforming to the shape of the through hole of the buffer sheet 143. A first surface of the second heat dissipation sheet 142 may contact the first heat dissipation sheet 141, and a second surface of the second heat dissipation sheet 142 may contact the driving circuit board 180. For example, the second heat dissipation sheet 142 may physically connect the first heat dissipation sheet 141 and the driving circuit board 180. The second heat dissipation sheet 142 may dissipate heat generated by the driving circuit board 180 to the outside. The second heat dissipation sheet 142 may be formed of a carbon-based material, such as, for example, graphite or graphene. An adhesive material may be applied onto the interface between the protective layer 120 and the protective sheet 140 and onto the interfaces between the layers of the protective sheet 140, respectively, and the protective layer 120 and the protective sheet 140 and the layers of the protective sheet 140 may be bonded together. The protective sheet 140 may include no light-shielding sheet, and the thickness of the protective sheet 140 may be reduced. For example, no light-shielding sheet may be provided in the protective sheet 140, and the display device 10 may become smaller, lighter and thinner.

The composition for forming the protective layer 120 may include a latent pigment "a". Each particle of the latent pigment "a" may have a core-shell structure in which a phase change material PCM may be microencapsulated with a polymer PM. For example, the polymer PM may surround the phase change material PCM, and may separate and protect the phase change material PCM from external materials. The phase change material PCM may include hydrocarbon, a wax such as an alkane mixture, an inorganic material such as hydrate salt, carbon nanotube, graphite, and graphene. In response to the temperature increasing, the phase change material PCM may be converted from its sold phase to its liquid phase, and may absorb heat. For example, due to heat generated upon use of the display device 10, the phase change material PCM may change its phase to a liquid, and may absorb the ambient temperature. The latent pigment "a" may absorb an increased heat from the use of the display device 10, and may release heat when the display device 10 is not in use. The protective layer 120 may include the latent pigment "a", and the protective layer 120 may provide improved heat dissipation capabilities.

In an exemplary embodiment, each particle of the latent pigment "a" may be formed in a circular shape. The latent pigment "a" may be formed in various colors depending on the type of the polymer PM used to form the shell of each particle thereof. The latent pigment "a" may be formed using a polymer PM that displays black. For example, the shell of each particle of the latent pigment "a" may be formed in black, and the protective layer 120 may have improved light-shielding capabilities.

The protective layer 120 of the display device 10 may include a chromic material, and may provide a light-shielding effect, and the protective sheet 140 may not include a light-shielding sheet. Accordingly, the display device 10 may become smaller, lighter and thinner. The protective layer 120 may include the latent pigment "a", and the protective layer 120 may provide improved heat dissipation capabilities.

A method of manufacturing a display device, according to an exemplary embodiment, will hereinafter be described.

FIGS. 7 to 12 illustrate cross-sectional views of a method of manufacturing a display device, according to an exemplary embodiment. Referring to FIGS. 7 to 12, the method of manufacturing a display device, according to an exemplary embodiment, may include preparing a display panel (S110), forming a protective layer (S120), forming an IC chip (S130), coupling a cover window (S140), and discoloring the protective layer (S150).

A display panel is prepared (S110).

Figure 7:
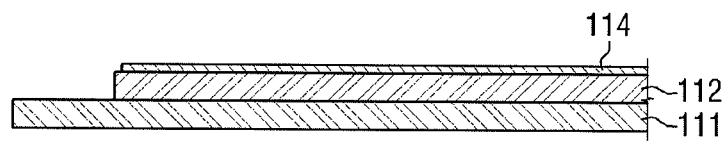
FIGS. 7 to 12 illustrate cross-sectional views of a method of manufacturing a display device, according to an exemplary embodiment.

FIG. 7 illustrates a schematic cross-sectional view of a display panel 110. As illustrated in FIG. 7, the display panel 110 may be, for example, an OLED display panel. The display panel 110 may include a first substrate 111 and a second substrate 112. The first substrate 111 may be divided into a display area where the first substrate 111 is bonded to the second substrate 112 and a mounting area where an IC chip 113 may be mounted. For example, the second substrate 112 may be smaller than the first substrate 111, an area of the first substrate 111 over which the second substrate 112 is bonded may be the display area. The first and second substrates 111 and 112 may be bonded and sealed together by a sealant, which may be arranged along the boundaries of the second substrate 112. An area of the first substrate 111 where the first substrate 111 is not bonded to the second substrate 112 may be the mounting area. In an exemplary embodiment, the display panel 110 may also include a polarizing member 114, which may be attached onto a first surface of the second substrate 112 and may suppress the reflection of external light. The polarizing member 114 may be optional. The structure of the display panel 110 may be substantially the same as that of its counterpart of FIGS. 1 to 6, and a detailed description thereof will be omitted.

Thereafter, a protective layer is formed (S120).

Figure 8:
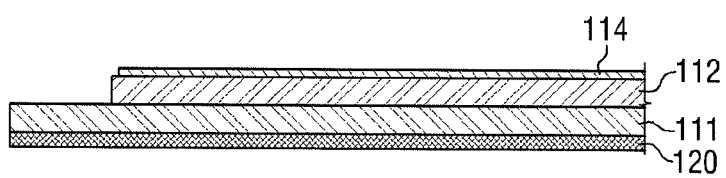

A protective layer 120 may protect the display panel 110 against external impact that may be generated at the bottom of the display panel 110. For example, the protective layer 120 may protect the display panel 110 against being scratched or damaged by impact during the fabrication of a display device 10. The protective layer 120 may be a coating layer formed by screen printing. For example, the protective layer 120 may be formed by screen-printing a composition including a thermal curing agent, fine powder silica, a silicone anti-foaming agent, an antistatic agent, a petroleum naphtha solvent, and diethyl glycol monoethyl ether acetate on a second surface of the first substrate 111, and subjecting the first substrate 111 to thermal curing. As illustrated in FIG. 8, the protective layer 120 may be formed to cover the entire second surface of the first substrate 111. The protective layer 120 may be cured for a predetermined amount of time at a temperature within a first temperature range. The first temperature range may be 80° C. to 100° C., and the predetermined amount of time may be 10 to 20 minutes. In an exemplary embodiment, the protective layer 120 may be cured for 15 minutes at a temperature of 90° C. The cured protective layer 120 may be transparent and may not be discolored.

The composition for forming the protective layer 120 may include a latent pigment "a". Each particle of the latent pigment "a" may have a core-shell structure in which a phase change material PCM is microencapsulated with a polymer PM. For example, the polymer PM may surround the phase change material PCM, and may separate and protect the phase change material PCM from external materials. In response to the temperature increasing, the phase change material PCM may be converted from its sold phase to its liquid phase, and may absorb heat. For example, due to heat generated upon use of the display device 10, the phase change material PCM may change its phase to a liquid, and may absorb the ambient temperature. The latent pigment "a" may absorb an increased heat from the use of the display device 10, and may release heat when the display device 10 is not in use.

Thereafter, an IC chip is formed (S130).

Figure 9:
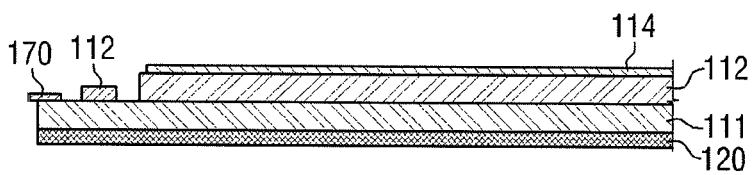

The IC chip 113 may be mounted in the mounting area of the first substrate 111 in a COG manner. The IC chip 113 may transmit a driving signal to each pixel formed in the display area of the first substrate 111. The first substrate 111 may also include pad electrodes, which may be arranged in the mounting area, and the IC chip 113 may be mounted in the mounting area that may be electrically connected to the pad electrodes. As illustrated in FIG. 9, an FPCB 170 may be connected to the mounting area of the first substrate 111 on one side thereof, and may be connected to a driving circuit board on the other side thereof, and a driving signal generated by the driving circuit board may be transmitted to the IC chip 113 or a driver of the first substrate 111 via the FPCB 170.

The IC chip 113 and the FPCB 170 may be pressed against, and mounted in, the mounting area of the first substrate 111. Traces of pressing the IC chip 113 and the FPCB 170 against the first substrate 111 may be detected, and a determination may be made as to whether the IC chip 113 and the FPCB 170 have been properly mounted. For example, traces of pressing the IC chip 113 and the FPCB 170 against the first substrate 111 may be formed on a bottom surface of the first substrate 111, and an auto trace test, which may involve determining whether the IC chip 113 and the FPCB 170 have been properly mounted by analyzing the number and shape of traces generated on the bottom surface of the first substrate 111, may be performed. The protective layer 120 may be transparent, and the traces formed on the bottom surface of the first substrate 111 may be easily detectable.

Thereafter, a cover window is coupled (S140).

Figure 10:
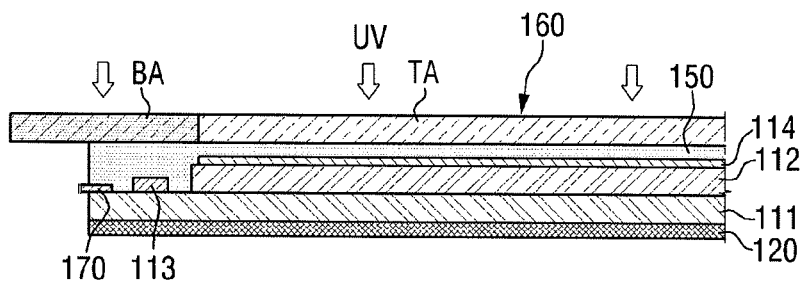

A cover window 160 may be disposed to face the second substrate 112 and the IC chip 113, and may cover the entire display panel 110. For example, the cover window 160 may cover a surface of the display panel 110 where an image may be displayed. The cover window 160 may be formed of a transparent material such as glass or plastic. An adhesive layer 150 may fill the gap between the display panel 110 and the cover window 160. For example, the adhesive layer 150 may fill the gap between the display panel 110 and the cover window 160, and may couple the cover window 160 and the display panel 110 together. The adhesive layer 150 may be formed of a material including an acryl-based resin that is curable by UV light or heat. The refractive index of the acryl-based resin may be more similar to the refractive index of the cover window 160 than to the refractive index of the air, the adhesive layer 150 may fill the gap between the second substrate 112 and the cover window 160, and the adhesive layer 150 may effectively reduce light reflection caused by a difference in refractive index. As illustrated in FIG. 10, in response to UV light being applied, the adhesive layer 150 may be cured. Coupling the second substrate 112 and the cover window 160 together may include applying UV light to the adhesive layer 150 from above the display device 10.

Thereafter, the protective layer may be discolored (S150).

Figure 11:
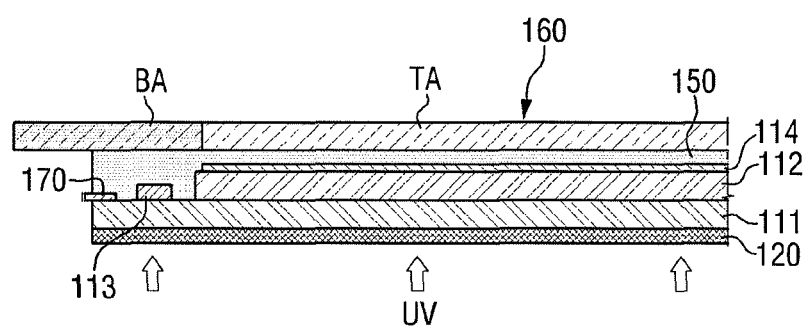

In an exemplary embodiment, the protective layer 120 may include a chromic material. For example, the composition for forming the protective layer 120 may also include a chromic material. The chromic material may be a material that may be converted from its colorless state to its colored state in response to light, heat, or a current being applied thereto. The chromic material may be distributed throughout the entire protective layer 120, and the color of the protective layer 120 may be determined by the color of the chromic material. The protective layer 120 may include a photochromic material that undergoes a change in its molecular structure, and may be converted to its colored state in response to light being applied thereto. In an exemplary embodiment, the protective layer 120 may include a photochromic material such as spiropyran, spirooxazines, diarylethenes, or aminoazobenzene, and may be discolored in response to light of a predetermined wavelength being applied thereto. As illustrated in FIG. 11, the protective layer 120 may be discolored in response to UV light being applied thereto. In this exemplary embodiment, discoloring the protective layer 120 may include applying UV light to the protective layer 120 from below the display device 10.

In an exemplary embodiment, the protective layer 120 may include an electrochromic material such as tungsten trioxide or viologen. For example, the protective layer 120 may be converted from its colorless state to its colored state in response to a current with a predetermined level being applied thereto. In this exemplary embodiment, discoloring the protective layer 120 may include applying a current with the predetermined level to the protective layer 120.

In an exemplary embodiment, the protective layer 120 may include a thermochromic material that is discolored under conditions at a predetermined temperature or higher. The predetermined temperature may be within a second temperature range, which may be higher than the first temperature range. In this exemplary embodiment, discoloring the protective layer 120 may include heating the protective layer 120 to a temperature within the second temperature range.

Once discolored, the protective layer 120 may prevent light emitted from the display panel 110 from leaking from below the bottom of the display panel 110. For example, the protective layer 120 not only may protect the display panel 110 against external impact that may be generated during the fabrication of the display device 10, but may also block the light emitted from the display panel 110.

Figure 12:
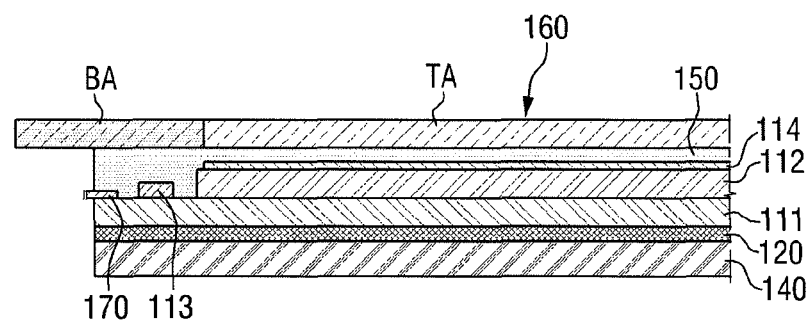

As illustrated in FIG. 12, the method of manufacturing a display device, according to an exemplary embodiment, may also include placing a protective sheet 140 below the discolored protective layer 120, e.g., the protective sheet may be placed on a surface of the discolored protective layer 120 opposite to a surface of the discolored protective layer 120 contacting the display panel 110. The display panel 110 with the protective sheet 140 attached thereon may be received in a bottom cover. The protective layer 120 of the display device 10 may include a chromic material, and may provide a light-shielding effect, and the protective sheet 140 may not include a light-shielding sheet. Accordingly, the display device 10 may become smaller, lighter and thinner.

The rest of the description of the method of manufacturing a display device, according to an exemplary embodiment, may be substantially identical to that of the display device 10 according to the exemplary embodiment of FIGS. 1 to 6, and will be omitted.

By way of summation and review, flat panel display devices may include a driving circuit board and a display panel, which may serve as heating elements, and may be equipped with a heat dissipating sheet for proper heat dissipation.

Flat panel display devices have become smaller, lighter and thinner. The miniaturization of flat panel display devices may not necessarily be in proportion to robustness in protection against, e.g., from, external impact, and flat panel display devices may be equipped with a protective layer for providing mechanical rigidity and robustness in protection against, e.g., from, external impact.

The presence of a simple stack of a heat dissipating sheet and a protective layer may increase the thickness of a flat panel display device.

Exemplary embodiments provide a display device and a method of manufacturing a display device that may be capable of maintaining or improving a heat dissipation function and a buffer function while providing smaller, lighter, and thinner display devices.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A display device, comprising:
   a display panel displaying an image;
   a bottom cover receiving the display panel therein; and
   a protective layer between the display panel and the cover and including a chromic material, the chromic material being a photochromic material that is discolored in response to light being applied thereto, a thermochromic material that is discolored at a temperature within a predetermined temperature range, or an electrochromic material that is discolored in response to a current with a predetermined level being applied thereto.

2. The display device as claimed in claim 1, wherein the chromic material is a photochromic material that is discolored in response to light being applied thereto.

3. A display device, comprising:
   a display panel displaying an image;
   a bottom cover receiving the display panel therein; and
   a protective layer between the display panel and the cover, the protective layer including a latent pigment.

4. The display device as claimed in claim 3, wherein the latent pigment includes a phase change material and a polymer surrounding the phase change material.

5. The display device as claimed in claim 1, further comprising a protective sheet between the protective layer and the bottom cover.

6. The display device as claimed in claim 5, wherein the protective sheet does not include a light-shielding sheet.

7. The display device as claimed in claim 1, wherein:
   the display panel includes a first substrate and a second substrate, the second substrate being on a first surface of the first substrate, and
   the protective layer covers an entire second surface of the first substrate.

8. The display device as claimed in claim 1, wherein the chromic material is a thermochromic material that is discolored at a temperature within a predetermined temperature range.

9. The display device as claimed in claim 1, wherein the chromic material is an electrochromic material that is discolored in response to a current with a predetermined level being applied thereto.

10. The display device as claimed in claim 1, wherein the protective layer is formed by screen printing.

11. A method of manufacturing a display device, the method comprising:
    preparing a display device including a first substrate and a second substrate, the second substrate being on a first surface of the first substrate;
    forming a protective layer on a second surface of the first substrate;
    forming an integrated circuit (IC) chip on the first surface of the first substrate;
    coupling the second substrate and a cover window together; and
    discoloring the protective layer.

12. The method as claimed in claim 11, wherein the display device further includes a polarizing member, which is on the second substrate.

13. The method as claimed in claim 11, wherein the protective layer includes:
    a latent pigment, which has a phase change material, and
    a polymer surrounding the phase change material.

14. The method as claimed in claim 11, further comprising placing a protective sheet on a surface of the protective layer opposite to a surface of the protective layer contacting the display device.

15. The method as claimed in claim 11, wherein:
    the IC chip is in a mounting area of the first substrate where the first substrate is not bonded to the second substrate, and
    forming the IC chip includes forming a flexible printed circuit board (FPCB), which transmits a driving signal to the IC chip, in the mounting area.

16. The method as claimed in claim 11, further comprising, before discoloring the protective layer, determining, from the second surface of the first substrate, whether the IC chip has been properly mounted.

17. The method as claimed in claim 11, wherein the protective layer includes a photochromic material that is discolored in response to light being applied thereto.

18. The method as claimed in claim 17, wherein:
    coupling the second substrate and the cover window together includes applying ultraviolet (UV) light to an adhesive layer, which is interposed between the second substrate and the cover window, and
    discoloring the protective layer includes applying the UV light to the protective layer.

19. The method as claimed in claim 11, wherein:
    forming the protective layer includes curing the protective layer at a temperature within a first temperature range,
    the protective layer includes a thermochromic material that is discolored at a temperature within a second temperature range, which is higher than the first temperature range, and
    discoloring the protective layer includes heating the protective layer to the temperature within the second temperature range.

20. The method as claimed in claim 11, wherein:
    the protective layer includes an electrochromic material that is discolored in response to a current with a predetermined level being applied thereto, and
    discoloring the protective layer includes applying the current with the predetermined level to the protective layer.

* * * * *